United States Patent
Leung et al.

(10) Patent No.: US 10,818,001 B2
(45) Date of Patent: Oct. 27, 2020

(54) USING STOCHASTIC FAILURE METRICS IN SEMICONDUCTOR MANUFACTURING

(71) Applicant: KLA-TENCOR CORPORATION, Milpitas, CA (US)

(72) Inventors: Wing-Shan Ribi Leung, Sunnyvale, CA (US); Kaushik Sah, Kessel Lo (BE); Allen Park, San Jose, CA (US); Andrew Cross, Hale (GB)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/241,467

(22) Filed: Jan. 7, 2019

(65) Prior Publication Data

US 2020/0082523 A1 Mar. 12, 2020

Related U.S. Application Data

(60) Provisional application No. 62/728,708, filed on Sep. 7, 2018.

(51) Int. Cl.
  *G06T 7/00* (2017.01)
  *G01N 21/95* (2006.01)

(52) U.S. Cl.
  CPC ....... *G06T 7/0004* (2013.01); *G01N 21/9501* (2013.01); *G06T 2207/30148* (2013.01)

(58) Field of Classification Search
  CPC ........ G06T 7/0004; G06T 2207/30148; G01N 21/9501
  See application file for complete search history.

(56) References Cited

U.S. PATENT DOCUMENTS

| | | | | |
|---|---|---|---|---|
| 6,757,621 | B2* | 6/2004 | Mizuno | G01R 31/2894 257/E21.525 |
| 2001/0036306 | A1* | 11/2001 | Wienecke | G01N 21/9501 382/149 |
| 2003/0223630 | A1 | 12/2003 | Adel et al. | |
| 2006/0249676 | A1* | 11/2006 | Shinada | H01J 37/29 250/310 |
| 2011/0276935 | A1* | 11/2011 | Fouquet | G06T 7/0006 716/112 |

(Continued)

FOREIGN PATENT DOCUMENTS

KR 1020160131110 A 11/2016

OTHER PUBLICATIONS

Sah et al., EUV Stochastic Defect Monitoring with Advanced Broadband Optical Wafer Inspection and E-Beam Review Systems, SPIE Int'l Conf. on EUV Lithography, Oct. 3, 2018.

(Continued)

*Primary Examiner* — Vincent H Tran
(74) *Attorney, Agent, or Firm* — Hodgson Russ LLP

(57) ABSTRACT

A stochastic calculation engine receives inputs from a semiconductor inspection tool or semiconductor review tool. The stochastic calculation engine determines abnormal locations and pattern variation from the inputs and determines stochastic failures from the inputs. An electronic data storage unit connected with the stochastic calculation engine can include a database with known stochastic behavior and known process metrology variations. The stochastic calculation engine can flag stochastic features, determine a failure rate, or determine fail probability.

20 Claims, 5 Drawing Sheets

(56) References Cited

U.S. PATENT DOCUMENTS

| | | | |
|---|---|---|---|
| 2013/0007684 A1* | 1/2013 | Kramer | G06F 30/398 |
| | | | 716/112 |
| 2013/0179847 A1 | 7/2013 | Hansen | |
| 2015/0069232 A1 | 3/2015 | Lin et al. | |
| 2015/0154746 A1* | 6/2015 | Zafar | G06T 7/0008 |
| | | | 382/149 |
| 2017/0010538 A1* | 1/2017 | Hansen | G06F 30/398 |
| 2017/0200264 A1* | 7/2017 | Park | G01N 21/9501 |
| 2018/0275523 A1* | 9/2018 | Biafore | G01N 21/956 |
| 2018/0300870 A1* | 10/2018 | Park | G06T 7/0006 |
| 2018/0330511 A1* | 11/2018 | Ha | G06K 9/6247 |
| 2019/0006147 A1* | 1/2019 | Kastrup | H01J 37/023 |
| 2019/0186910 A1* | 6/2019 | Fukuda | G03F 7/70625 |

OTHER PUBLICATIONS

De Bisschop, Stochastic Effects in EUV Lithography: Random, Local CD Variability, and Printing Failures, J. of Micro/Nanolithography, MEMS, and MOEMS, 2017, vol. 16(4).
WIPO, ISR for PCT/US2019/049830, Dec. 20, 2019.

\* cited by examiner

USING STOCHASTIC FAILURE METRICS IN SEMICONDUCTOR MANUFACTURING

CROSS-REFERENCE TO RELATED APPLICATIONS

This application claims priority to the provisional patent application filed Sep. 7, 2018 and assigned U.S. App. No. 62/728,708, the disclosure of which is hereby incorporated by reference.

FIELD OF THE DISCLOSURE

This disclosure relates to semiconductor inspection and metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Metrology processes are also used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Defect classification often cannot be performed based on just images or information generated by a wafer inspection tool. In these instances, additional information may be generated using a defect review tool and defect classification is then determined based on the additional information. In some such instances, defects found by an optical defect finding apparatus may be reviewed using a high resolution scanning electron microscope (SEM) review tool. Defect review may, however, also be performed using an optical-based system. For example, laser-based defect review may be performed to verify a defect population detected by optical inspection.

As exposure doses decrease and resist dimensions shrink to less than about one hundred nanometers, stochastic resist effects and the effects of critical-dimension scanning electron microscopy upon the resist image become non-negligible. Decreasing the wavelength of illumination during lithography decreases the number of photons from the illumination source needed to expose the sample with a given dose of radiation due to increased photon energy (e.g., the photon energy of illumination is inversely proportional to wavelength or proportional to frequency). Decreasing the number of photons incident on the sample may increase the photon shot noise (PSN), a naturally-occurring phenomenon related to the uncertainty of absorption of a photon in a given volume of a sample. The effects of PSN are particularly problematic for EUV with the lower number of photons associated with these lithographic processes. As the size of features to be fabricated approaches the size of photosensitive molecules in a resist (e.g., photoacid generators (PAGs)), a random distribution of photosensitive molecules in the resist may introduce additional uncertainty associated with the absorption of photons in a given volume of the sample. Accordingly, stochastic noise associated with photon absorption may be a complex convolution of the photon statistics and the resist interaction terms. As a result, certain fabrication defects may occur stochastically, even under nominally identical fabrication conditions. Stochastic defects are becoming a problem for advanced design rules. Stochastic defects are by their nature random, but they are seen to affect weak patterns (or hotspots) with higher frequency. Dose change is a variable to which stochastics failures tend to be most sensitive, but their frequency can be influenced by influenced by changing dose, optical proximity correction (OPC), critical dimension (CD), design, or pitch. Stochastically-occurring fabrication defects, or stochastic defects, may occur with a certain probability when nominally identical structures are fabricated under nominally identical conditions at multiple locations within a field, at a given location across multiple fields on a single wafer, or at a given location on a sample across multiple wafers.

Stochastic defects may present multiple challenges in a fabrication environment. Typically, defects may be assumed to be deterministic such that a known defect will consistently be present when fabricated according to a known production recipe including a pattern of elements to be fabricated on a sample and exposure parameters. For example, process window qualification (PWQ) typically identifies process-limiting defects that always occur when exposure conditions fall outside of a process window. For instance, a process window may define limits on the defocus associated with the position of the sample along the optical axis of the lithography tool (e.g., the focal position of the sample) or the dose of energy from the illumination source incident on the sample during exposure. Accordingly, the presence of stochastic defects that do not always occur under given exposure conditions may introduce uncertainty into typical PWQ algorithms.

Previous techniques to determine stochastic failures used empirical characterization or identification of stochastic behavior. These previous techniques manually compared various locations of failure and by compared failure rates at high to low dose modulations. Non-stochastics also needed to be manually separated from the stochastic failures. These previous techniques are not able to cover larger wafer area, can only cover limited number of critical features, and do not use a direct output of inspection system or yield management software. The stochastic failure metric is defined as total number of failed critical feature divided by total number of critical features inspected. SEM image based offline analysis typically also cannot cover a high number of critical features in timely manner. Previous techniques also did not consider design when determining stochastic failures.

Therefore, improved systems and techniques to determine stochastic failures are needed.

BRIEF SUMMARY OF THE DISCLOSURE

A system is provided in a first embodiment. The system comprises a semiconductor inspection tool or a semiconductor review tool that provides inputs and an electronic data storage unit that includes a database with known stochastic behavior and known process metrology variations. A stochastic calculation engine in electronic communication with the electronic data storage unit is configured to receive the inputs from the semiconductor inspection tool or the semiconductor review tool, determine abnormal locations and pattern variation from the inputs, and determine stochastic failures from the inputs.

The semiconductor inspection tool or the semiconductor review tool can use an electron beam or a photon beam.

The inputs can include one or more of metrology rules, defect rules, design rules, wafer level data, yield analysis, equipment data, fault diagnostics, or mask variation.

The stochastic calculation engine can be further configured to determine a failure rate from the inputs.

The stochastic calculation engine can be further configured to determine a fail probability of a critical feature from the inputs.

The stochastic calculation engine can be further configured to determine random defects and non-stochastic failures from the inputs.

The stochastic calculation engine can run on a neural network.

A method is provided in a second embodiment. The method comprises receiving inputs from a semiconductor inspection tool or a semiconductor review tool at a stochastic calculation engine. Abnormal locations and pattern variation are determined from the inputs using the stochastic calculation engine. Stochastic failures are determined from the inputs using the stochastic calculation engine.

The method can include flagging stochastic features associated with the stochastic failures. In an instance, an inspection of the stochastic features is performed. This can further include verifying the stochastic features based on results of the inspection.

The method can include imaging a semiconductor wafer with a semiconductor inspection tool or a semiconductor review tool that uses an electron beam.

The method can include imaging a semiconductor wafer with a semiconductor inspection tool that uses a photon beam.

The inputs can include one or more of metrology rules, defect rules, design rules, wafer level data, yield analysis, equipment data, fault diagnostics, or mask variation.

The method can include determining a failure rate from the inputs using the stochastic calculation engine.

The method can include determining a fail probability of a critical feature from the inputs using the stochastic calculation engine.

The method can include determining random defects and non-stochastic failures from the inputs using the stochastic calculation engine.

The stochastic calculation engine can run on a neural network.

A non-transitory computer readable medium can store a program configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein use an integrated circuit (IC) design file to guide inspection. The IC design file can be used to conduct analysis of optical and/or electron beam inspection to output a stochastic failure metric for a semiconductor fabrication process. The IC design file also can be used to provide a direct output from an inspection system or yield management software.

To obtain reasonable stochastic failure rate of a given feature with statistical significance, large area inspections are generally required. Stochastic events are typically low probability events. For example, a stochastic event may be one failure in a trillion in case of valid yield. The feature dimension (e.g., critical dimension) distribution is often non-normal with skewed tail. It is the tail events ($7\sigma$) that may be flagged and then various metrics describing the failures can be calculated. Traditional CD SEM, review SEM, or even slow inspection SEM based coverage is inadequate for detecting a $7\sigma$ event. Furthermore, stochastic events are complex and may be based on poorly understood relationships. A design-integrated, optical inspection-coupled fast SEM review or inspection system can be used instead to calculate stochastic fail rates. This will provide a larger coverage of a sample, higher throughput, and incorporates the IC design.

Incorporation of various data sources along with defect inspection data for calculation of stochastic failure probability can be used to determine stochastic failures. These data sources include, for example, CD, pitch, line edge roughness (LER), line width roughness (LWR), surface roughness, exposure focus, exposure dose, photomask measurements, design context, or other parameters. The data sources can be used to correlate to defect or metrology data to identify sources of variation. Having these sources in one place can assist when segregating design or process systematics from stochastic defects.

Figure 1:
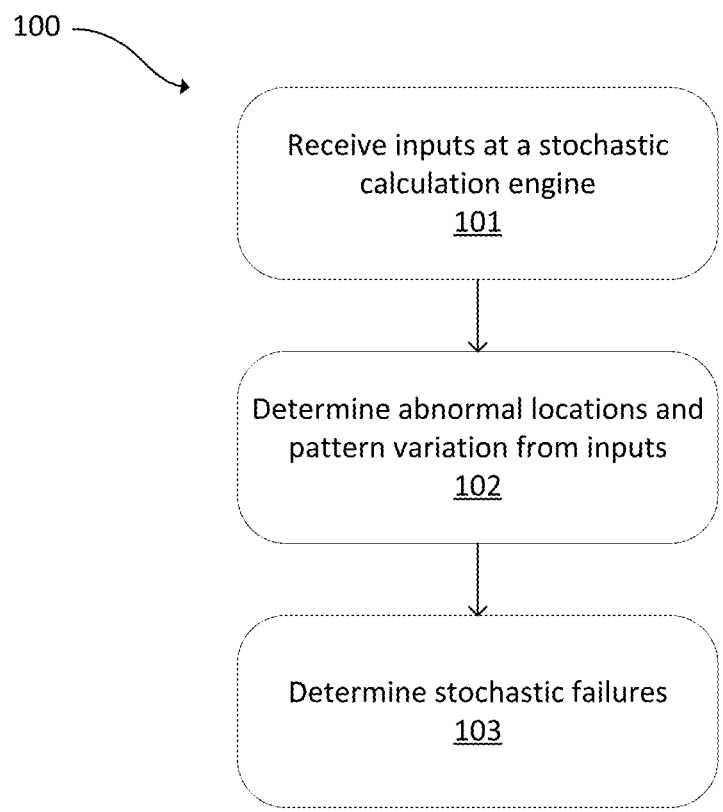
FIG. 1 is a flowchart of a method in accordance with the present disclosure.

FIG. 1 is a flowchart of a method 100. Inputs are received from a semiconductor inspection tool or a semiconductor review tool at a stochastic calculation engine at 101. The inputs can include one or more of metrology rules, defect rules, design rules, wafer level data (e.g., potential location of stochastic defects and design hotspots), yield analysis (e.g., total impact), equipment data, fault diagnostics, or mask variation. The inputs also can include data such as, for example, CD, pitch, LER, LWR, surface roughness, exposure focus, exposure dose, photomask measurements, design context, or other parameters. Other inputs are possible. Direct output of a wafer inspection system or yield management software can be used. In an instance, the inputs include design hotspot, pitch, dose, LER, or LWR.

The inputs can be chosen based on a particular design or type of stochastic defects. For example, higher LER or LWR may indicate higher probability of stochastic defects. Tighter pitch can lead to increased stochastic defects. Excess dose variation on the lower side can lead to increased stochastic defects.

The images that can provide the input can be generated with a semiconductor inspection tool or semiconductor review tool that uses an electron beam or a photon beam. Other semiconductor inspection tools that use x-rays or ion beams also can be used.

Abnormal locations and pattern variation are determined from the inputs using the stochastic calculation engine at 102. The stochastic calculation engine can run using a machine learning approach such as a neural network. After defect inspection, segregation from true design/process systematics to possible stochastic impact is needed. The design context may be studied locally. If failure points are changing between one location to another for the same pattern context (which can be determined by both optical and review SEM image analysis and other defect attributes provided by an inspection tool), then the pattern is a stochastic hotspot. For a true design hotspot, the same point will fail all the time. Such distinctions can be made as an additional step beyond design based grouping (DBG) using inspection tool's attributes and various rules from other sources. The failure rate can be calculated by taking the ratio of number of instances a stochastic pattern fails to the total number of such patterns inspected, which can be determined from a design. If a hotspot is known to be stochastic, for example, from simulations or historic records from yield management software that can be used a priori, such as an example for targeted inspections and fail rate calculations.

Stochastic failures are determined from the inputs using the stochastic calculation engine, which may be run using the neural network, at 103. The design can be used in DBG of inspection tool results and to determine the frequency of each group (e.g., to calculate fail rate) in the inspection area.

Stochastic features associated with the stochastic failures can be flagged after the stochastic failure is determined or identified. An inspection can be performed on the stochastic features that are flagged, such as with an SEM. The stochastic features can be verified based on results of this inspection.

Figure 4:
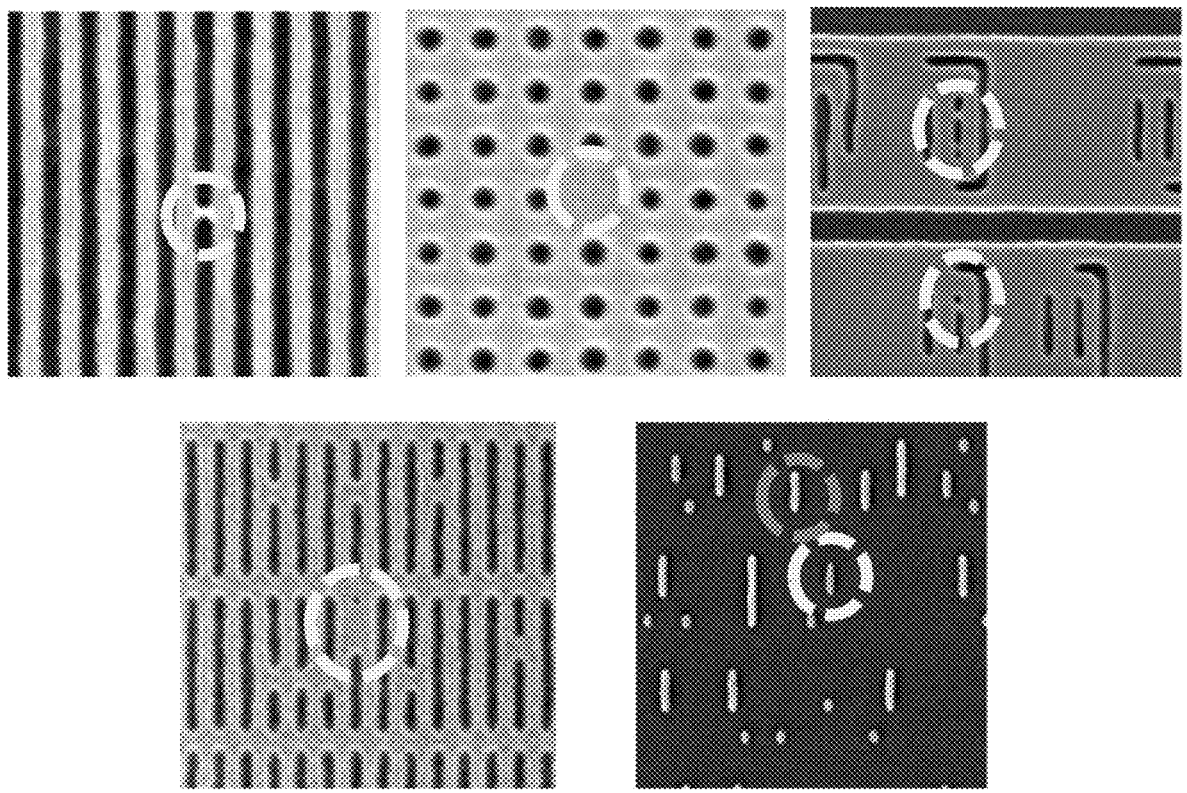
FIG. 4 illustrates examples of stochastic features.

FIG. 4 illustrates examples of stochastic features. Typical defect characteristics can be a result of photon, chemical shot noise, reduced feature size, or other causes. The stochastic features may be random and isolated in nature, but weak patterns (hotspots) can be affected with higher frequency. Failures can happen irrespective of pattern type. The fail probability may be low and non-Gaussian, and can be influenced by CD, dose, OPC, pitch, material, or other causes.

Figure 5:
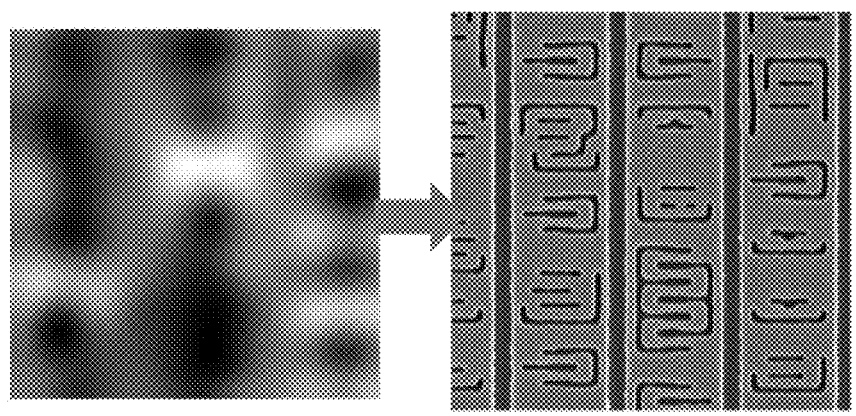
FIG. 5 illustrates stochastic hot spots.
Figure 5:
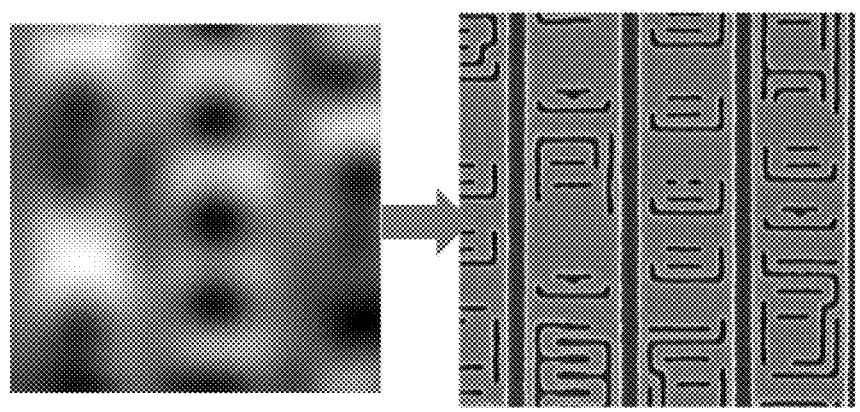
Figure 5:
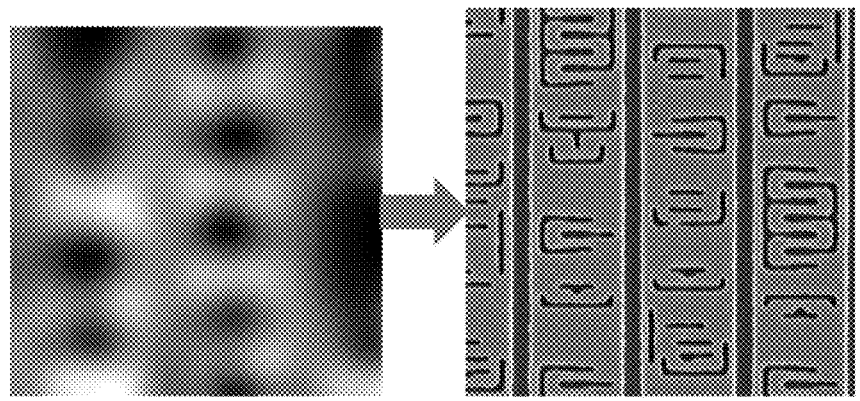

FIG. 5 illustrates stochastic hot spots. Different trenches fail with different rates. Each type has its own fail probability.

In an instance, a guided inspection can be determined based on the location or features of the stochastic failures. The guided inspection can search for or look at similar locations of potential stochastic failures. The guided inspection can be used to flag the stochastic features. A sampling method may be recommended for a guided inspection to gather more data.

A failure rate can be determined from the inputs using the stochastic calculation engine. Failure rate is the number of stochastic failures per type of context (e.g., design group) over a number of inspected of such type of context or design group.

A fail probability of a critical feature can be determined from the inputs using the stochastic calculation engine. Fail probability is the probability of a specific structure or structure type being affected by a stochastic failure. This can be empirically measured as a fail rate or computed using simulation.

Random defects and non-stochastic failures also can be determined from the inputs using the stochastic calculation engine. Pattern defects (e.g., hotspots) that are not subjected to stochastic effects are called non-stochastic failures. Random defects are generally particle type defects. Advanced sampling and classification can be used to separate stochastic features from other failures.

In an alternate embodiment, SEM-based images are used offline without the IC design in the method 100 to determine stochastic failures.

A non-transitory computer readable medium can store a program configured to instruct a processor to execute an embodiment of the method 100.

The method 100 can be used to provide multiple benefits. First, the IC design file information can be used to understand a total number of critical features. The IC design file also can be used to guide inspection and/or defect classification.

Second, combining IC design file information with machine learning technology can be used to conduct classification of optical inspection results, SEM inspection results, and/or SEM review results to analyze number of stochastic failure critical patterns. Stochastics can be determined based on known behavior or by evaluating variations in the nature of behavior or fail characters. This determination may be automated.

Third, stochastic failure metric(s) can be directly outputted from inspection system. One of the metrics can be the fail rate.

Fourth, stochastic failure metric(s) can be directly outputted per process window parameters for example dose, focus, or other parameters. The process window parameters may be similar to process window features.

Figure 2:
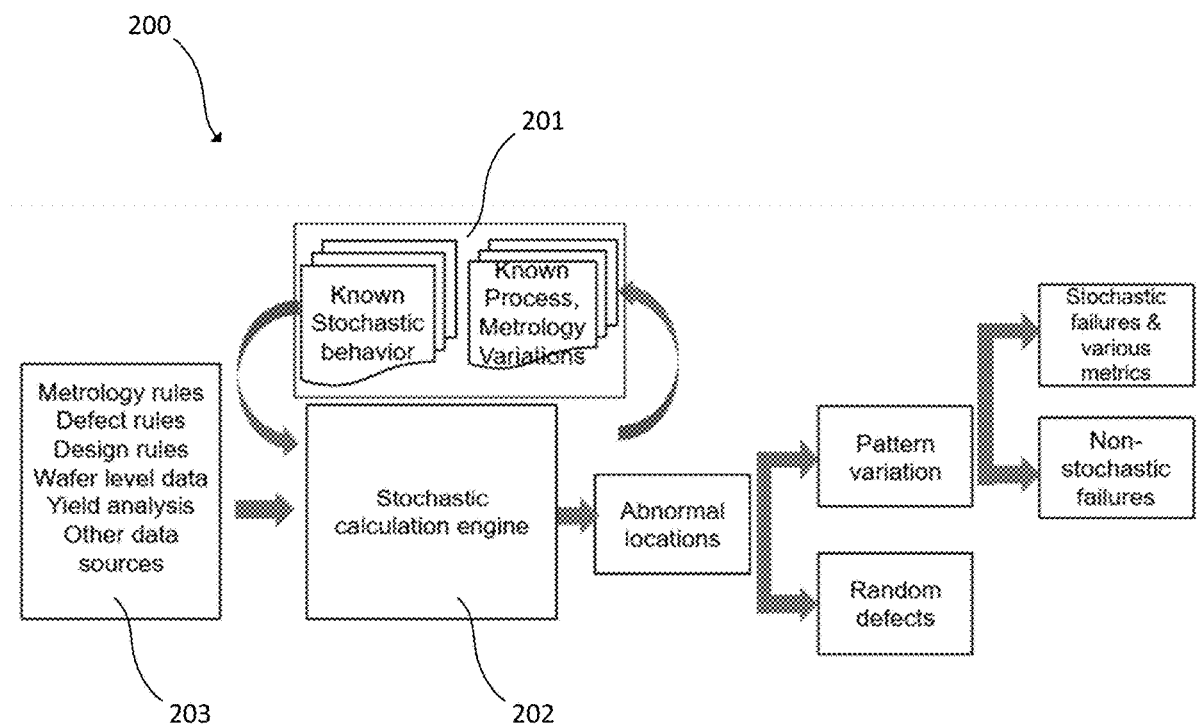
FIG. 2 is a block diagram of a system in accordance with the present disclosure.

FIG. 2 is a block diagram of a system 200 that integrates data sources and calculates probability of stochastic behavior or failure. An electronic data storage unit 201 includes a database with known stochastic behavior and known process metrology variations. The known stochastic behavior and/or known process metrology variations also can be stored, pulled into, or pulled from yield management software. A stochastic calculation engine 202 is in electronic communication with the electronic data storage unit 201. The stochastic calculation engine 202 is configured to receive the inputs 203 from a semiconductor inspection tool or semiconductor review tool. The semiconductor inspection tool or semiconductor review tool can use, for example, an electron beam or a photon beam. The inputs include one or more of metrology rules (e.g., line space), defect rules, design rules, wafer level data, yield analysis, equipment data, fault diagnostics, or mask variation. Other inputs are possible. The stochastic calculation engine 202 can determine abnormal locations and pattern variation from the inputs and determine stochastic failures from the inputs.

The stochastic engine 202 can find hotspots or weak points and determine if these are consistent or at a random location. Abnormal locations may be considered as defects (e.g., physical variation, pattern variation, or dimension changes). Models and/or decision trees may be generated. A cluster analysis of expected behavior may be performed to find outliers.

The stochastic calculation engine 202 can further be configured based on the inputs to determine a failure rate, a fail probability of a critical feature, or random defects and non-stochastic failures.

Using the stochastic calculation engine 202, IC design information can be used to understand a total number of critical features, guide optical or SEM inspection, compute variations in defect characteristics, or to evaluate or classify defects to compute stochastic events on a semiconductor wafer. Various metrics such as failure rates or fail probabilities of critical features due to stochastics can be determined. A defect inspection system or yield management software can directly output the stochastic failure metrics. Based on expected behavior of pattern based on various input attributes (e.g. CD or CD distribution, LER/LWR distribution, focus, dose distribution, defect quantity and distribution, normalized deviation from design, etc.), each failure can be identified and quantified.

The stochastic calculation engine 202 can continue to learn to improve its model. This may use a deep learning system, such as a neural network.

The stochastic calculation engine 202 can be implemented as part of a semiconductor inspection tool or semiconductor review tool. The stochastic calculation engine 202 also can operate as a standalone unit, such as a yield management system for a semiconductor manufacturing facility. The stochastic calculation engine 202 can operate online or offline. The stochastic calculation engine 202 can operate with or without the IC design.

The stochastic calculation engine 202 can automatically determine stochastics based on known behavior or by evaluating variations in the nature of behavior or fail characteristics. Design layout-guided inspection and flagging of stochastic features in a region of interest (e.g., an inspection area or care area) can be performed using the stochastic calculation engine 202.

Other sampling and localization can be performed using the stochastic calculation engine 202. First, diverse sampling based on failure point distribution and context can be used to capture different fail points of the same feature. Second, through dose behavior can further help isolated stochastic events from other random or design systematic events. Through dose behavior may be available in a modulated wafer (e.g., in PWQ or Process Window Discovery). Third, spatial context surrounding the failures can be captured to understand if the failure is a true design systematic or exaggerated by stochastic effects.

The stochastic calculation engine 202 can be combined with SEM review or SEM inspection verification of flagged defects. Calculation of false rate can be performed if no abnormality was seen.

Design-based computation of all instances of a feature in a care area can be performed. This output can have two flavors: one disregarding OPC (only with design intent) and another considering OPC differences. The computation can also have context parameters. For example, how much of the surrounding context can be considered when trying to find a match.

A failure metric output from inspection system or yield management software can be used. Failure rate can be calculated, and other dimensional or size metrics can be obtained from SEM review of flagged locations. Variations can then be studied. These variations are expected to be extremes because they were flagged by inspection systems based on higher signal than background. Thus, these can represent tails of the size distribution. Feature variation ranges can be obtained from this information.

Fail rates can further be sub-tagged as "most failing region" within the feature in consideration. This can be, for example, a "middle," "end," or "corner". Such tagging can help identify weak points of stochastic failures which can reveal information to designers. For example, a feature failing more often in one region than another may have a systematic design issue exaggerated by stochastic effects.

A large review sample may limit throughput, but the defect data can be normalized with false rate, such as those generated from an IC design file.

The stochastic calculation engine 202, which can operate using a processor, can be run using a neural network (e.g., a convolutional neural network (CNN) module). The stochastic calculation engine 202 can have one of the configurations described further herein. Rooted in neural network technology, deep learning is a probabilistic graph model with many neuron layers, commonly known as a deep architecture. Deep learning technology processes the information such as image, text, voice, and so on in a hierarchical manner. In using deep learning in the present disclosure, feature extraction is accomplished automatically using learning from data. For example, defects can be classified, sorted, or binned using the stochastic calculation engine 202 based on the one or more extracted features.

Image classification and prediction using a neural network either in classification or regression mode can be used to flag multiple fail points in the same design context. This can help separate stochastic hotspots from non-stochastic hotspots. A neural network also can be used for historic ranking of features most useful to predict stochastic behavior, such as using data stored in yield management software.

Generally speaking, deep learning (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output, allowing the algorithm to use multiple processing layers, composed of multiple linear and non-linear transformations.

Deep learning is part of a broader family of machine learning methods based on learning representations of data. An observation (e.g., a feature to be extracted for reference) can be represented in many ways such as a vector of intensity values per pixel, or in a more abstract way as a set of edges, regions of particular shape, etc. Some representations are better than others at simplifying the learning task (e.g., face recognition or facial expression recognition). Deep learning can provide efficient algorithms for unsupervised or semi-supervised feature learning and hierarchical feature extraction.

Research in this area attempts to make better representations and create models to learn these representations from large-scale data. Some of the representations are inspired by advances in neuroscience and are loosely based on interpretation of information processing and communication patterns in a nervous system, such as neural coding which attempts to define a relationship between various stimuli and associated neuronal responses in the brain.

There are many variants of neural networks with deep architecture depending on the probability specification and network architecture, including, but not limited to, Deep Belief Networks (DBN), Restricted Boltzmann Machines (RBM), and Auto-Encoders. Another type of deep neural network, a CNN, can be used for feature analysis. The actual implementation may vary depending on the size of input images, the number of features to be analyzed, and the nature of the problem. Other layers may be included in the stochastic calculation engine 202 besides the neural networks disclosed herein.

In an embodiment, the deep learning model is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. Machine learning explores the study and construction of algorithms that can learn from and make predictions on data. Such algorithms overcome following strictly static program instructions by making data driven predictions or decisions, through building a model from sample inputs.

In some embodiments, the deep learning model is a generative model. A generative model can be generally defined as a model that is probabilistic in nature. In other words, a generative model is one that performs forward simulation or rule-based approaches. The generative model can be learned (in that its parameters can be learned) based on a suitable training set of data. In one embodiment, the deep learning model is configured as a deep generative model. For example, the model may be configured to have a deep learning architecture in that the model may include multiple layers, which perform a number of algorithms or transformations.

In another embodiment, the deep learning model is configured as a neural network. In a further embodiment, the deep learning model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In one embodiment, the deep learning model used for the semiconductor inspection applications disclosed herein is configured as an AlexNet. For example, an AlexNet includes a number of convolutional layers (e.g., 5) followed by a number of fully connected layers (e.g., 3) that are, in combination, configured and trained to analyze features for determining rotation and translation offsets. In another such embodiment, the deep learning model used for the semiconductor inspection applications disclosed herein is configured as a GoogleNet. For example, a GoogleNet may include layers such as convolutional, pooling, and fully connected layers such as those described further herein configured and trained to analyze features for determining rotation and translation offsets. While the GoogleNet architecture may include a relatively high number of layers (especially compared to some other neural networks described herein), some of the layers may be operating in parallel, and groups of layers that function in parallel with each other are generally referred to as inception modules. Other of the layers may operate sequentially. Therefore, GoogleNets are different from other neural networks described herein in that not all of the layers are arranged in a sequential structure. The parallel layers may be similar to Google's Inception Network or other structures.

In a further such embodiment, the deep learning model used for the semiconductor inspection applications disclosed herein is configured as a Visual Geometry Group (VGG) network. For example, VGG networks were created by increasing the number of convolutional layers while fixing other parameters of the architecture. Adding convolutional layers to increase depth is made possible by using substantially small convolutional filters in all of the layers. Like the other neural networks described herein, VGG networks were created and trained to analyze features for determining rotation and translation offsets. VGG networks also include convolutional layers followed by fully connected layers.

In some such embodiments, the deep learning model used for the semiconductor inspection applications disclosed herein is configured as a deep residual network. For example, like some other networks described herein, a deep residual network may include convolutional layers followed by fully-connected layers, which are, in combination, configured and trained for feature property extraction. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart.

In a further such embodiment, the deep learning model used for the semiconductor inspection applications disclosed herein includes one or more fully connected layers configured for analyzing features for determining rotation and translation offsets. A fully connected layer may be generally defined as a layer in which each of the nodes is connected to each of the nodes in the previous layer. The fully connected layer(s) may perform classification based on the features extracted by convolutional layer(s), which may be configured as described further herein. The fully connected layer(s) are configured for feature selection and classification. In other words, the fully connected layer(s) select features from a feature map and then analyze the input image(s) based on the selected features. The selected features may include all of the features in the feature map (if appropriate) or only some of the features in the feature map.

In some embodiments, the information determined by the deep learning model includes feature properties extracted by the deep learning model. In one such embodiment, the deep learning model includes one or more convolutional layers. The convolutional layer(s) may have any suitable configuration known in the art. In this manner, the deep learning model (or at least a part of the deep learning model) may be configured as a CNN. For example, the deep learning model may be configured as a CNN, which is usually stacks of convolution and pooling layers, to extract local features. The embodiments described herein can take advantage of deep learning concepts such as a CNN to solve the normally intractable representation inversion problem. The deep learning model may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

In general, the deep learning model described herein is a trained deep learning model. For example, the deep learning model may be previously trained by one or more other systems and/or methods. The deep learning model is already generated and trained and then the functionality of the model is determined as described herein, which can then be used to perform one or more additional functions for the deep learning model.

As stated above, although a CNN is used herein to illustrate the architecture of a deep learning system, the present disclosure is not limited to a CNN. Other variants of deep learning architectures may be used in embodiments. For example, Auto-Encoders, DBNs, and RBMs, can be used. Random forests also can be used.

Training data may be inputted to model training (e.g., CNN training), which may be performed in any suitable manner. For example, the model training may include inputting the training data to the deep learning model (e.g., a CNN) and modifying one or more parameters of the model until the output of the model is the same as (or substantially the same as) external validation data. Model training may generate one or more trained models, which may then be sent to model selection, which is performed using validation data. The results that are produced by each one or more trained models for the validation data that is input to the one or more trained models may be compared to the validation data to determine which of the models is the best model. For example, the model that produces results that most closely match the validation data may be selected as the best model. Test data may then be used for model evaluation of the model that is selected (e.g., the best model). Model evaluation may be performed in any suitable manner. Best model may also be sent, to model deployment in which the best model may be sent to the semiconductor inspection tool for use (post-training mode).

In an embodiment, the stochastic calculation engine includes a model that is trained with identified samples. The model can be validated with new data, which also can be used to continually train the model. Training may end when the model is stabilized. In an instance, the stochastic calculation engine is trained with inputs that may be most valuable for a particular layer, pattern, or application. Inputs that are related to variables that modulate stochastics may be more valuable for training the stochastic calculation engine. This can include exposure conditions, pattern layout, pitch, or CD. This also can include LER/LWR or certain defect attributes computed using design. Then images can be also used by truncating the dimension using standard methods like principle component analysis (PCA). Then the stochastic calculation engine is used for that particular layer, pattern, or application.

Figure 3:
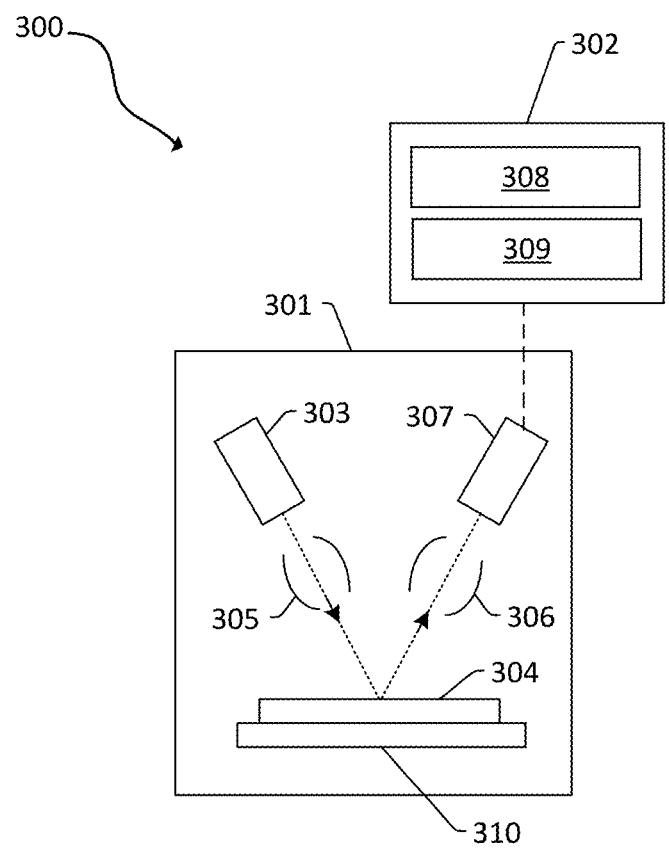
FIG. 3 is a block diagram of a semiconductor inspection tool in accordance with the present disclosure.

FIG. 3 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 3, the output acquisition subsystem includes electron column 301, which is coupled to computer subsystem 302. A stage 310 may hold the wafer 304.

As also shown in FIG. 3, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 3 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the wafer 304 thereby forming electron beam images of the wafer 304. The electron beam images may include any suitable electron beam images. Computer subsystem 302 may be configured to perform any of the functions described herein using the output of the detector 307 and/or the electron beam images. Computer subsystem 302 may be configured to perform any additional step(s) described herein. A system 300 that includes the output acquisition subsystem shown in FIG. 3 may be further configured as described herein.

It is noted that FIG. 3 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 3 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices. The processor 308 can include an embodiment of the stochastic calculation engine 202. The electronic data storage unit 309 can include or can be an embodiment of the electronic data storage unit 201.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The processor 308 is in electronic communication with the wafer inspection tool, such as the detector 307. The processor 308 may be configured to process images generated using measurements from the detector 307. For example, the processor may perform embodiments of the method 100.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

An additional embodiment relates to a non-transitory computer-readable medium storing program instructions executable on a processor. In particular, a processor, such as the processor 308, can be coupled to a memory in an electronic data storage medium with non-transitory computer-readable medium, such as the electronic data storage unit 309, that includes executable program instructions. The computer-implemented method may include any step(s) of any method(s) described herein. For example, processor 308 may be programmed to perform some or all of the steps of method 100. The memory in the electronic data storage unit 309 may be a storage medium such as a magnetic or optical disk, a magnetic tape, or any other suitable non-transitory computer-readable medium known in the art.

While disclosed with respect to the system 300, optical or x-ray systems also can be used to generate the images or inputs for the method 100 or stochastic calculation engine 202.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a semiconductor inspection tool or a semiconductor review tool that provides inputs;
an electronic data storage unit that includes a database with known stochastic behavior and known process metrology variations; and
a stochastic calculation engine that runs on a neural network in electronic communication with the electronic data storage unit configured to:
receive the inputs from the semiconductor inspection tool or the semiconductor review tool;
receive an integrated circuit design file;
determine abnormal locations and pattern variation from the inputs; and
determine stochastic failures from the inputs and the integrated circuit design file.

2. The system of claim 1, wherein the semiconductor inspection tool or the semiconductor review tool uses an electron beam.

3. The system of claim 1, wherein the semiconductor inspection tool uses a photon beam.

4. The system of claim 1, wherein the inputs include one or more of metrology rules, defect rules, design rules, wafer level data, yield analysis, equipment data, fault diagnostics, or mask variation.

5. The system of claim 1, wherein the stochastic calculation engine is further configured to determine a failure rate from the inputs.

6. The system of claim 1, wherein the stochastic calculation engine is further configured to determine a fail probability of a critical feature from the inputs.

7. The system of claim 1, wherein the stochastic calculation engine is further configured to determine random defects and non-stochastic failures from the inputs.

8. The system of claim 1, wherein the inputs include images from the semiconductor inspection tool or the semiconductor review tool.

9. A method comprising:
receiving inputs from a semiconductor inspection tool or a semiconductor review tool at a stochastic calculation engine that runs on a neural network;
receiving an integrated circuit design file at the stochastic calculation engine;
determining abnormal locations and pattern variation from the inputs using the stochastic calculation engine; and
determining stochastic failures from the inputs and the integrated circuit design file using the stochastic calculation engine.

10. The method of claim 9, further comprising flagging stochastic features associated with the stochastic failures.

11. The method of claim 10, further comprising performing an inspection of the stochastic features.

12. The method of claim 11, further comprising verifying the stochastic features based on results of the inspection.

13. The method of claim 9, further comprising imaging a semiconductor wafer with the semiconductor inspection tool or the semiconductor review tool, wherein the semiconductor inspection tool or the semiconductor review tool uses an electron beam.

14. The method of claim 9, further comprising imaging a semiconductor wafer with the semiconductor inspection tool, wherein the semiconductor inspection tool uses a photon beam.

15. The method of claim 9, wherein the inputs include one or more of metrology rules, defect rules, design rules, wafer level data, yield analysis, equipment data, fault diagnostics, or mask variation.

16. The method of claim 9, further comprising determining a failure rate from the inputs using the stochastic calculation engine.

17. The method of claim 9, further comprising determining a fail probability of a critical feature from the inputs using the stochastic calculation engine.

18. The method of claim 9, further comprising determining random defects and non-stochastic failures from the inputs using the stochastic calculation engine.

19. A non-transitory computer readable medium storing a program configured to instruct a processor to execute the method of claim 9.

20. The method of claim 9, wherein the inputs include images from the semiconductor inspection tool or the semiconductor review tool.

* * * * *